United States Patent
Collins et al.

(10) Patent No.: US 7,709,274 B1
(45) Date of Patent: May 4, 2010

(54) METHOD FOR FORMING AN RUOX ELECTRODE AND STRUCTURE

(75) Inventors: Steven R. Collins, Lexington, MA (US); Abron S. Toure, Portland, OR (US); Steven D. Bernstein, Brighton, MA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 137 days.

(21) Appl. No.: 11/806,191

(22) Filed: May 30, 2007

(51) Int. Cl.
*H01L 21/00* (2006.01)

(52) U.S. Cl. .................. 438/3; 438/722; 257/E21.305

(58) Field of Classification Search .............. 438/3, 438/737, 722, 717, 734
See application file for complete search history.

(56) References Cited

U.S. PATENT DOCUMENTS

| | | | |
|---|---|---|---|
| 4,387,145 A * | 6/1983 | Lehrer et al. ............ | 216/12 |
| 5,135,608 A | 8/1992 | Okutani | |
| 5,443,688 A | 8/1995 | Toure | |
| 5,792,377 A * | 8/1998 | Belcher et al. ............ | 216/87 |
| 6,623,988 B2 * | 9/2003 | Park ............................ | 438/3 |
| 6,943,039 B2 * | 9/2005 | Ying et al. .................. | 438/3 |

* cited by examiner

*Primary Examiner*—Walter L Lindsay, Jr.
*Assistant Examiner*—Reema Patel
(74) *Attorney, Agent, or Firm*—John Tarlano

(57) ABSTRACT

A method for forming an RuOx electrode comprising depositing a TiW layer on an RuOx layer, forming a photo-resist mask on the TiW layer, in order to mask the TiW layer into a masked TiW layer, etching the masked TiW layer with a CF4 plasma, a TiW mask being formed on the RuOx layer, the CF4 plasma is not etching the RuOx and vaporizing unmasked RuOx portion of the RuOx layer with an oxygen plasma, the masked RuOx layer being formed into an RuOx electrode.

2 Claims, 5 Drawing Sheets

METHOD FOR FORMING AN RUOX ELECTRODE AND STRUCTURE

A prior art method for forming a ruthenium oxide (RuOx) layer into an RuOx electrode involved wet chemical etching of the RuOx layer. The wet chemical etching method involved use of wet chemicals, such as chlorine or fluorine. Due to a lack of easy use of the wet chemical, the wet chemical etching method was not satisfactory. In an RuOx layer, x can have a decimal value such as 0.8, Another prior art Method for forming a ruthenium oxide (RuOx) layer into an RuOx involved ion milling the RuOx layer. The ion milling method was not an efficient manufacturing method. The ion milling method provided only a low throughput of RuOx electrodes. The ion milling method did not provide selectivity of underlying RuOx layers, such as in a sandwich structure that had a buried RuOx layer or multiple level RuOx layers.

The present method involves forming an RuOx electrode by forming a titanium-tungsten (TiW) alloy mask on an RuOx layer The masked RuOx layer is formed into an RuOx electrode by oxygen plasma etching the masked RuOx layer, thus forming the RuOx electrode.

The method of the present invention involves placement of a TiW layer on the RuOx layer and formation of the TiW layer into a TiW mask. The TiW masked RuOx layer is then etched by an oxygen plasma. A TiW mask is used in the oxygen plasma, since a TiW mask is highly resistant to oxygen plasma.

After an RuOx electrode is formed, the TiW mask and RuOx electrode can remain permanently attached together. Alternately, the TiW mask can be removed from the RuOx electrode. The disclosed method also allows for an efficiently manufacturing of multi-layer RuOx electrodes.

An oxygen plasma of a reactive ion etch (RIE) method, is used in order to pattern a TiW masked RuOx layer into an RuOx electrode. The TiW mask is used to mask portions of the RuOx layer. Unmasked portions of the RuOx layer are then vaporized by the oxygen plasma. The disclosed method allows for a high throughput of RuOx electrodes.

The present method also involves oxygen plasma vaporization of unmasked portions of multilevel TiW masked RuOx layers. Multilevel RuOx electrodes are thus formed. Multilevel RuOx electrodes are formed as electrodes of a ferroelectric capacitor.

Ferroelectric capacitors can be successfully fabricated by means of the disclosed TiW masking and oxygen plasma etching method. The resultant capacitors have a performance level that meets industry standards.

SUMMARY OF THE INVENTION

A method for forming an RuOx layer into an RuOx electrode comprising, depositing a TiW layer on the RuOx layer, forming a photo-resist mask on the TiW layer, in order to form a masked TiW layer, exposing the masked TiW layer to CF4, a TiW mask being formed on the RuOx layer, and vaporizing unmasked portion of the RuOx layer with an oxygen plasma, the RuOx layer being patterned into an RuOx electrode.

DESCRIPTION OF THE PREFERRED EMBODIMENT

Figure 1:
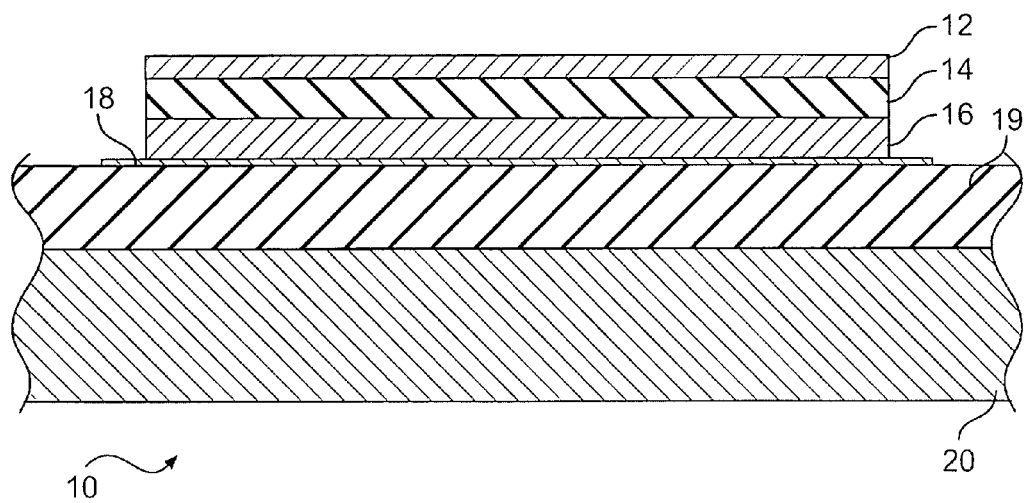
FIG. 1 is a sectional view of a sandwich structure having an uppermost first RuOx layer, a PZT ferroelectric layer, a second RuOx layer, a Ti adhesion layer, a silicon oxide insulator layer and a silicon layer.

The present oxygen plasma method is used in patterning ruthenium oxide (RuOx) layers of a sandwich structure 10 of FIG. 1. The sandwich structure 10 has an uppermost first RuOx layer 12. The sandwich structure 10 also has a PZT ferroelectric layer 14 in contact with the first RuOx layer 12. The sandwich structure 10 further has a second RuOx layer 16 in contact with the PZT layer 14. Still further the sandwich structure 10 has a titanium (Ti) adhesion layer 18 in contact with the second RuOx layer 16. The sandwich structure 10 has a silicon oxide insulator layer 19 in contact with the Ti adhesion layer 18. Finally the sandwich structure 10 has a silicon layer 20 in contact with the silicon oxide insulator layer 19

PZT is an alloy that has the general chemical formula $Pb_xZr_yO_3$. PZT is a ternary alloy of lead oxide, zirconium oxide and titanium oxide.

The RuOx layer 12, the PZT layer 14 and the RuOx layer 16 are 2000 angstroms thick. The Ti adhesion layer 18 is 500 angstroms thick. The silicon oxide insulator layer 19 is 4000 angstroms thick. The silicon layer 20 is a base for the other layer of structure 10. Silicon layer 20 can be a section of a thin silicon wafer (not shown). The Ti adhesion layer 18 is oxidized after it is deposited on the silicon oxide insulator layer 19.

Figure 2:
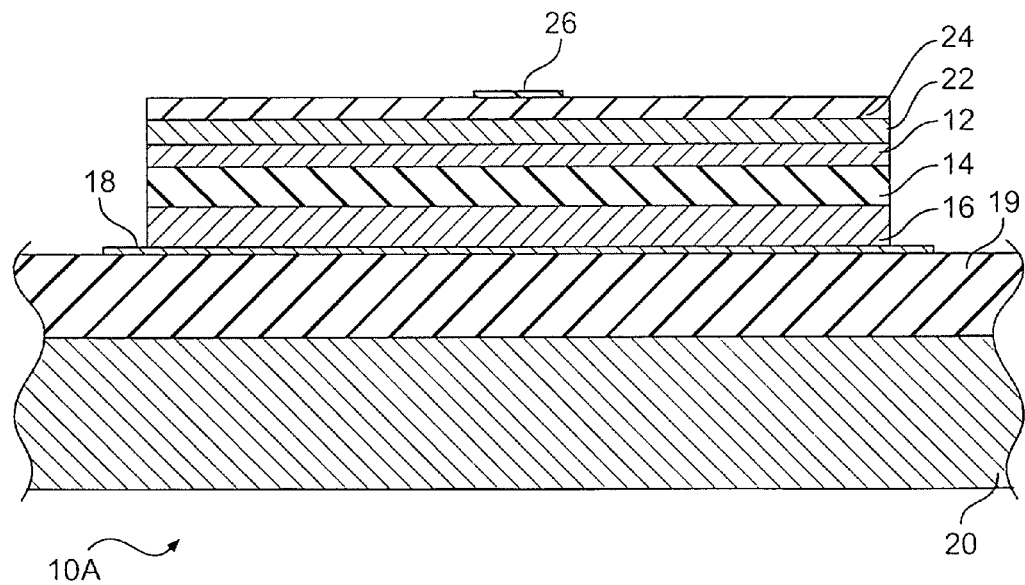
FIG. 2 is a sectional view of the sandwich structure FIG. 1, plus a sectional view of additional sandwich structure having a TiW layer in contact with the first RuOx layer, a photo-resist film and a photographic mask.

As shown in FIG. 2, a first titanium-tungsten (TiW) alloy layer 22 has been laid down on the first RuOx layer 12, such as by use of a TiW sputtering technique. The first TiW layer 22 is 1200 angstroms thick. A photo-resist film 24 is laid down on the first TiW layer 22. A photographic mask 26 is placed on the photo-resist film 24.

The photographic mask 26 and photo-resist film 24 are exposed to ultraviolet light. Then, the exposed photo-resist film 24 is processed with a photo-resist developer. A photo-resist mask 30 is thus formed on the first TiW layer 22, as shown in FIG. 3.

Figure 3:
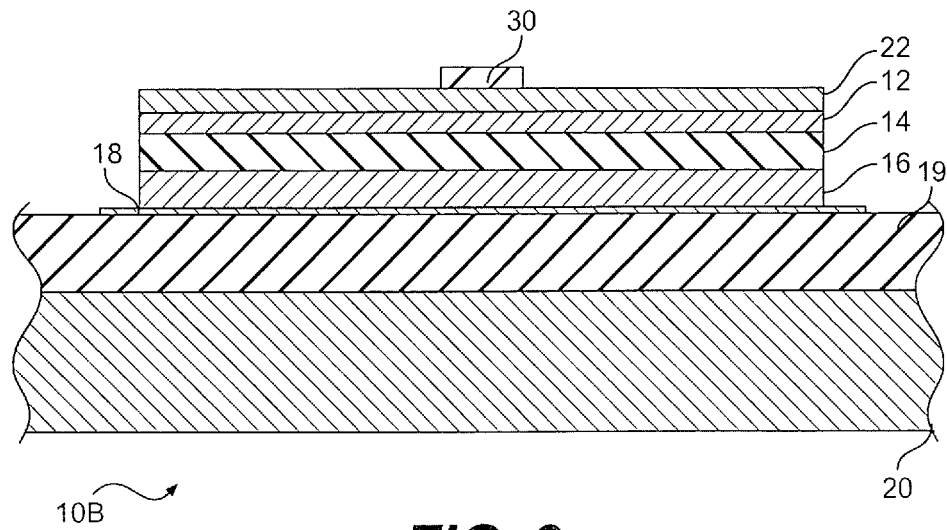
FIG. 3 is a sectional view of the sandwich structure of FIG. 1, plus a sectional view of additional sandwich structure having a TiW layer in contact with the first RuOx layer and a photo-resist mask.
Figure 4:
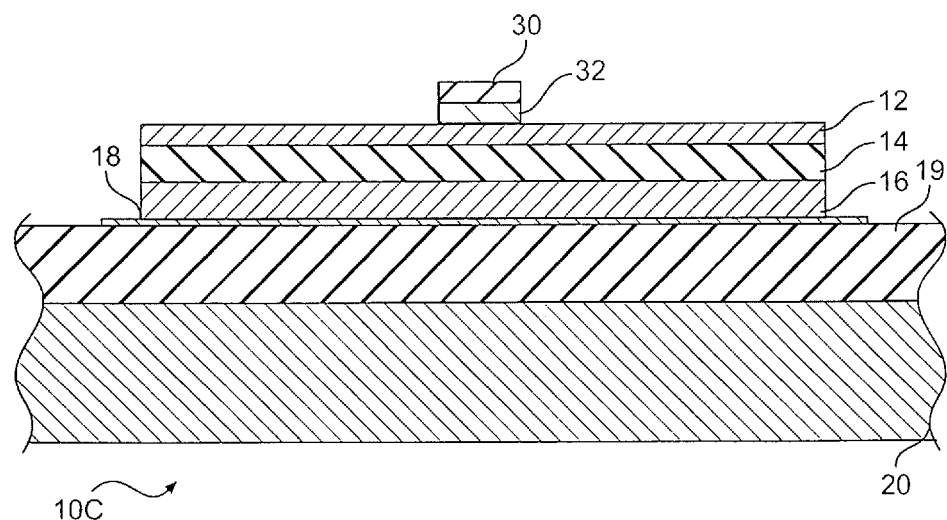
FIG. 4 is a sectional view of the sandwich structure of FIG. 1, plus sectional view of additional sandwich structure having a TiW mask in contact with the first RuOx layer and a photo-resist mask.

FIG. 3 shows the photo resist mask 30 on the first TiW layer 22. The TiW layer 22 of FIG. 3 is etched with a CF4 plasma in an RIE machine, to form a first TiW mask 32, as shown in FIG. 4. The CF4 plasma forms the first TiW mask 32. During the etching with a CF4 plasma, the photo-resist mask 30 remains in place, as shown in FIG. 4.

Conventional photo-resist image processing techniques are used to transfer the desired photographic pattern of photographic mask 26 into the photo-resist layer 24 that has been deposited on the TiW layer 22. A photoresist mask 30 is formed on TiW layer 22 as shown in FIG. 3.

Figure 4A:
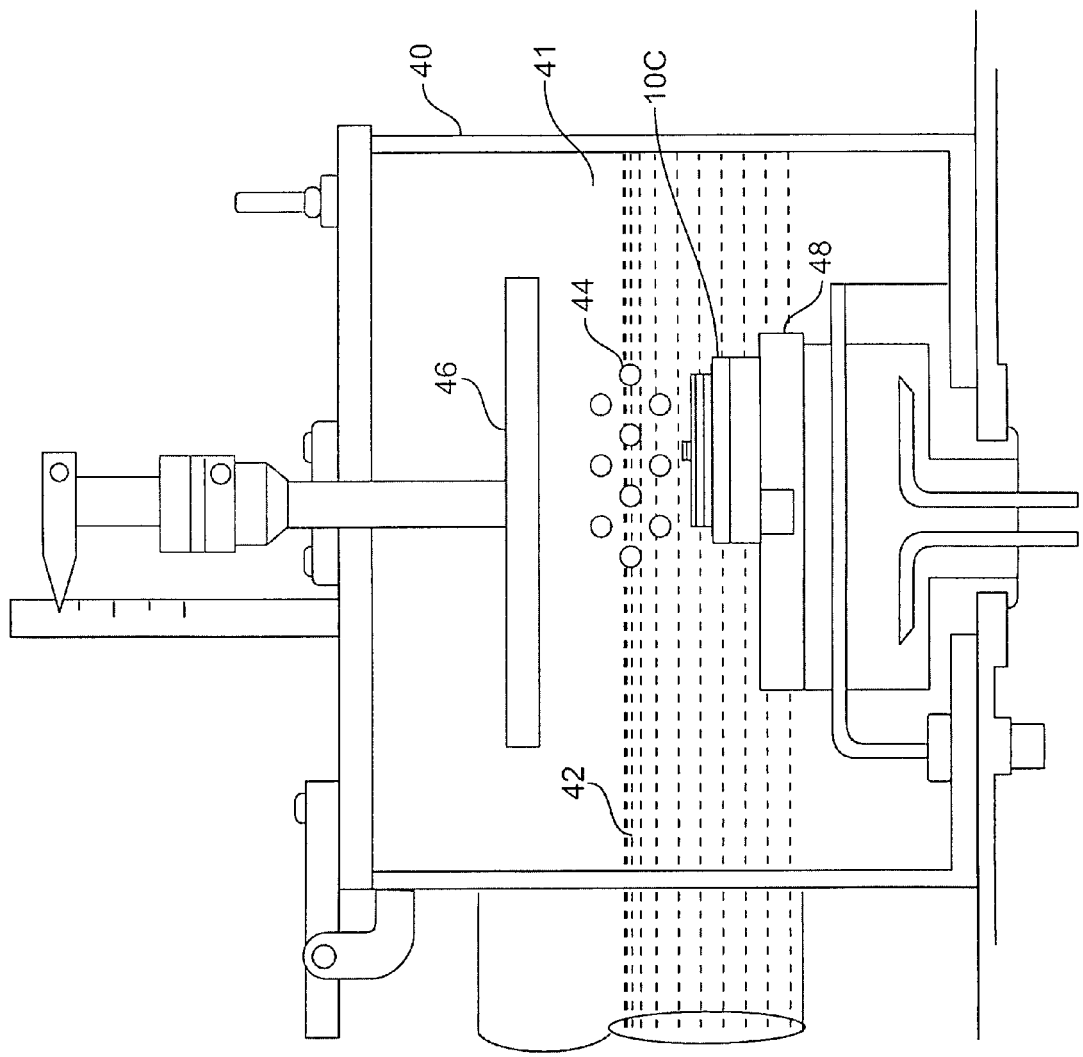
FIG. 4A is a sectional view of an RIE machine 40 plus the sandwich structure of FIG. 4

A mask pattern, of photo-resist mask 30, is then transferred into the first TiW layer 22 by an CF4 plasma of a reactive ion etch (RIE) process in an RIE machine 40, shown in FIG. 4A. A first TiW mask 32 is formed from TiW layer 22, in machine 40, shown in FIG. 4A. The conditions used with the RIE machine 40 are: CF4 at 112 sccm, O2 at 10 sccm, 100 millitorr pressure, 200 watts of RF power. The etch rate of the TiW layer 22 is 310 angstroms per minute. The first TiW mask 32 is thusly formed on the first RuOx layer 12 in RIE machine 40 in 3.87 minutes. In FIG. 4 the TiW mask 32 is shown as having been formed on an outer surface of the first RuOx layer 12.

Figure 5:
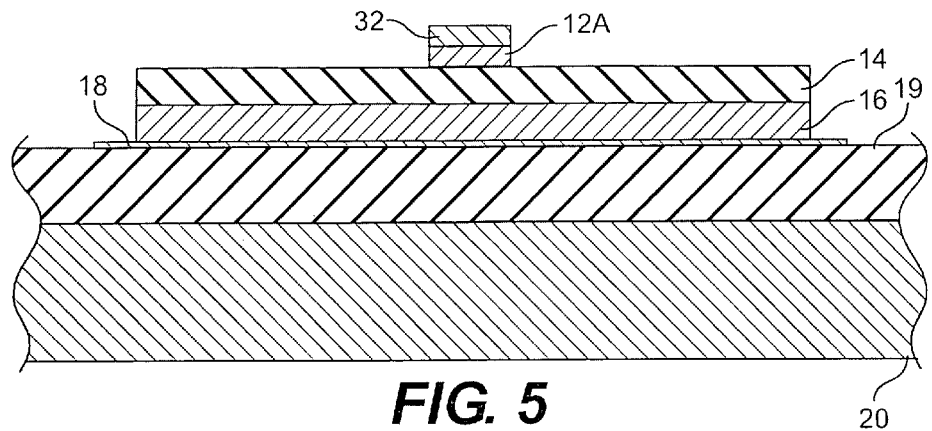
FIG. 5 is a sectional view of a sandwich structure having an uppermost a first TiW mask, a first RuOx electrode, a PZT ferroelectric layer, a second RuOx layer, a Ti adhesion layer, a silicon oxide insulator layer and a silicon layer.

An oxygen plasma etching method is then used on the TiW masked RuOx layer 12, in RIE machine 40, shown in FIG. 4A, to pattern the TiW masked RuOx layer 12 of FIG. 4 into first RuOx electrode 12A, shown in FIG. 5. RuOx electrode 12A is formed as a result of the application of the oxygen plasma method to the TiW masked RuOx layer 12, shown in FIG. 4. The photo-resist mask 30 is removed from the first TiW mask 32, during application of oxygen plasma to the TiW masked RuOx layer 12, as shown in FIG. 5.

To obtain the structure shown in FIG. 5, the sandwich 10C of FIG. 4 is placed in a chamber 41 of a Materials Research diode type RIE machine 40, as shown in FIG. 4A. As shown in FIG. 4A, oxygen 42 is ionized in the RIE machine 40, to form an oxygen plasma 44. The oxygen plasma 44 vaporizes unmasked portions of the RuOx layer 12 of sandwich 10C of FIG. 4. The vaporization is due to an oxidation type chemical reaction of the oxygen plasma 44 with unmasked portions of the RuOx layer 12. A first RuOx electrode 12A, shown in FIG. 5, is formed from RuOx layer 12, during the oxygen plasma oxidation process. The oxidation reaction that, takes place in the chamber 41 of the RIE machine 40 is a chemical conversion of unmasked portions of RuOx layer 12 into gaseous oxide, such as RuO4.

The preferred system for use in performing the oxidation process is an RIE machine 40. The RIE machine 40 is manufactured by Materials Research Corporation and is an RIE 61 type plasma machine. The machine 40 has a diode system with a 20 inch diameter chamber 41, a 16 inch diameter anode 46 and a 12 inch diameter cathode 48.

The sandwich 10C of FIG. 4, whose masked RuOx layer 12 is to be processed, is placed on the bottom cathode 48. The cathode 48 is supplied with RF power at 13.56 megahertz. Vaporization of unmasked portions of the RuOx layer 12 is accomplished by introducing oxygen, O2, at a flow rate of 50 sccm into the chamber 41 of RIE plasma machine 40, adjusting the pumping speed with a throttle valve, to achieve a chamber pressure of 100 millitorr and by applying 300 watts of RF power to the cathode 48.

For the above given parameters in using machine 40, the etch rate for RuOx layer 12, where x equals 0.8, is 110 angstroms per minute. The RuOx layer 12 has a thickness of 2000 angstroms. Therefore unmasked portions of RuOx layer 12 are removed from PZT layer 14 in 18.181 minutes.

A TiW masked Ru layer, a TiW masked RuO2 layer or a TiW masked RuOx layer can be oxygen plasma etched, that is, vaporized, in machine 40. x can have an integer value or decimal value.

The first TiW mask 32 can remain in place while PZT layer 14 is patterned, and while second RuOx layer 16 is patterned. Alternately, the first TiW mask 32 can be removed from the first RuOx electrode 12A by using a hydrogen peroxide solution at 50 degrees centigrade for 3 minutes. The underlying first RuOx electrode 12A, PZT layer 14 and second RuOx layer 16 are unaffected by the hydrogen peroxide.

Again, the first TiW mask 32 is formed in order to patterning the RuOx layer 12 into the first RuOx electrode 12A. A 1200 angstrom thick TiW layer 22 is deposited on the RuOx layer 12 and the TiW layer 22 is then masked by photo-resist mask 30, and etched, in order to form first TiW mask 32.

It is noted that oxygen plasma is a very effective photo-resist mask remover. The etch rate of a photo-resist mask by an oxygen plasma is approximately 1 micrometer per minute.

Figure 6:
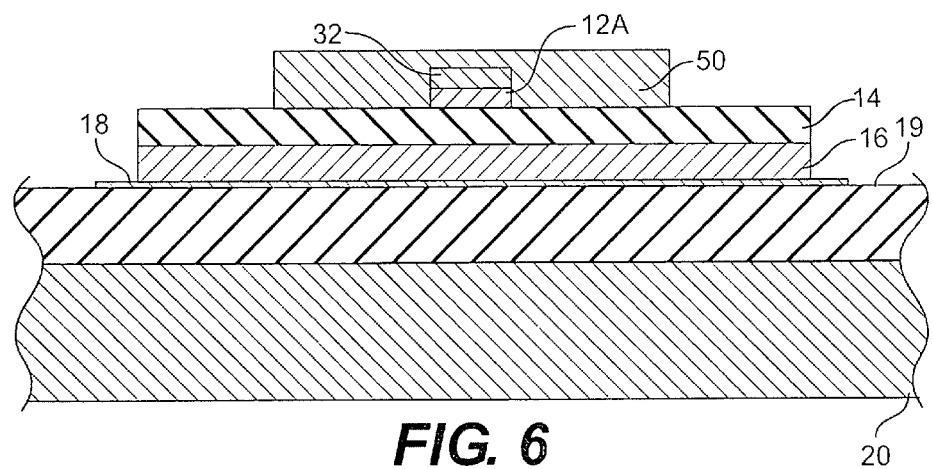
FIG. 6 is a sectional view of a sandwich structure of FIG. 5 plus a second TiW mask 50 in contact with the PZT ferroelectric layer, first TiW mask and first RuOx electrode.

Thereafter, PZT layer 14 is masked by a second TiW mask 50, as shown in FIG. 6. The second TiW mask 50 is formed in the same manner as described for the formation of first TiW mask 32 of FIG. 4. A second TiW layer (not shown) is used in forming second TiW mask 50.

Figure 7:
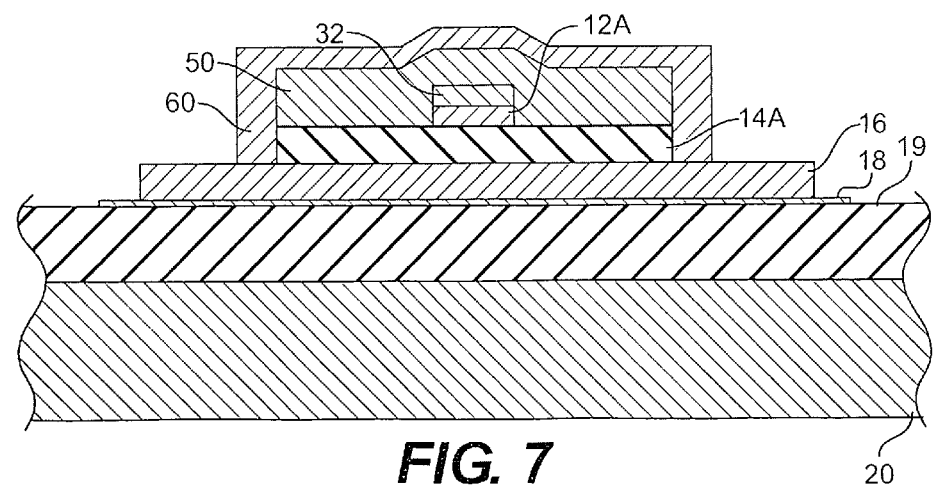
FIG. 7 is a sectional view of a sandwich structure having a third TiW mask in contact with each of the second TiW mask 50 and PZT ferroelectric plate and second RuOx layer, a Ti adhesion layer, a silicon oxide insulator layer and a silicon layer.

The masked PZT layer 14 of FIG. 6 is patterned by a plasma etching method using a chloride and fluorocarbon plasma This plasma etching method is disclosed in U.S. Pat. No. 5,443,688, issued Aug. 22, 1995. The teaching of the '688 patent are incorporated herein by reference. As shown in FIG. 7, a PZT ferroelectric plate 14A is formed by the etching method of the '688 patent.

A third TiW mask 60 is formed on second RuOx layer 16, as also shown in FIG. 7. The third TiW mask 60 is formed, on second RuOx layer 16, by the method described above for forming a first TiW mask 32. The third TiW mask 60 is formed from a third TiW layer (not shown).

The above described oxygen plasma RIE process is applied to masked second RuOx layer 16. An second RuOx electrode 16A is formed, as shown in FIG. 8, from second RuOx layer 16, shown in FIG. 7.

Again, the PZT layer 14 is patterned by a method such described in U.S. Pat. No. 5,443,688, to form PZT plate 14A under first RuOx electrode 12A. The lower RuOx layer 16 is patterned using an oxygen RIE process to form a second RuOx electrode 16A under PZT plate 14A. The oxygen RIE process is described for patterning the first RuOx layer 12 that is above PZT layer 14. The second RuOx electrode 16A; as shown in FIG. 8, is formed from the lower RuOx layer 16, shown in FIG. 7.

The oxygen plasma RIE process is used to etch TiW masked RuOx layer 12 and simultaneously remove the photo resist-mask 30. The TiW mask 32 is unaffected by the oxygen RIE process. The TiW mask 32 serves as an effective mask, in a transfer of the TiW mask pattern to the RuOx layer 12. Since the TiW mask 32 is unaffected by the oxygen plasma, the TiW mask 32 serves effectively as a mask.

Figure 8:
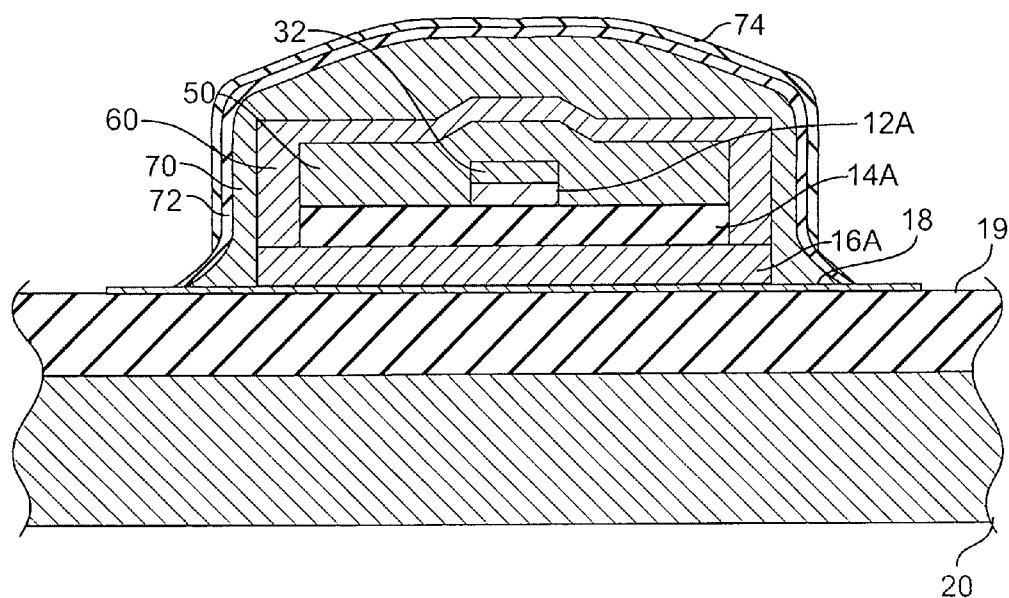
FIG. 8 is a sectional view of the sandwich structure of FIG. 7, plus a sectional view of additional sandwich structure having a fourth TiW layer in contact with the third TiW mask, a photo-resist layer and a photographic mask.

The underlying Ti adhesion layer 18, shown in FIG. 8, is patterned by first depositing a 2800 angstrom thick fourth TiW layer 70 over exposed portions of the Ti adhesion layer 18 and over the third TiW mask 60. A photo-resist layer 72 is placed on the fourth TiW layer 70. A photographic mask 74 is placed on photo-resist layer 72. A fourth TiW mask (not shown) is formed on the Ti adhesion layer 18. The fourth TiW mask is used in plasma etching the Ti adhesion layer 18. A plasma RIE process used to etch the Ti adhesion layer 18. The plasma RIE process, for etching Ti adhesion layer 18, uses CCl2F2 at 107 sccm, O2 at 1 sccm, 15 millitorr pressure, 100 watts of RF power. The etch rate equals 80 angstroms per minute in the MRC system.

Thereafter, the TiW masks 32, 50, 60 and the fourth TiW mask, are striped away to form a nearly completed PZT ferroelectric capacitor. The stripping is done by applying a 50 degree centigrade hydrogen peroxide solution to the TiW masks.

Figure 9:
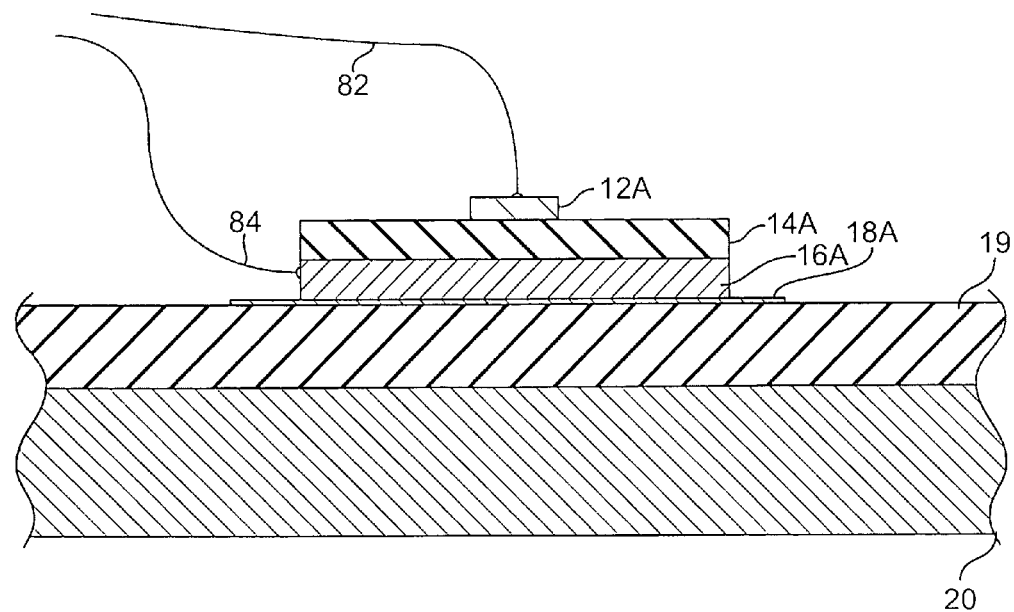
FIG. 9 is a sectional view of a completed ferroelectric capacitor.

A completed PZT ferroelectric capacitor 80 is shown in FIG. 9. Electrical lead 82 has been attached to first RuOx electrode 12A. Electrical lead 84 has been attached to second RuOx electrode 16A.

While the present invention has been disclosed in connection with the preferred embodiment thereof, it should be understood that there are other embodiments which fall within the spirit and scope of the invention as defined by the following claims.

What is claimed is:

1. A method for forming an RuOx electrode, comprising:
   a) depositing a TiW layer on top of and in direct contact with an RuOx layer;
   b) forming a photo-resist mask on the TiW layer, in order to mask the TiW layer into a masked TiW layer;
   c) etching the masked TiW layer with a CF4 plasma, a TiW mask being formed on top of and in direct contact with the RuOx layer, the CF4 plasma not etching the RuOx layer; and
   d) vaporizing the unmasked portion of the RuOx layer with an oxygen plasma, the masked RuOx layer being formed into an RuOx electrode.

2. A method of forming a ferroelectric capacitor structure from a sandwich structure, the sandwich structure comprising a first RuOx layer, a PZT layer in contact with the first RuOx layer, and a second RuOx layer in contact with the PZT layer, the method comprising:
   a) forming a first TiW mask on an outer surface of the first RuOx layer by depositing a TiW layer on the first RuOx layer, forming a photo-resist mask on the TiW layer, in order to mask the TiW layer into a masked TiW layer, and etching the masked TiW layer with a CF4 plasma, a TiW mask being formed on the first RuOx layer, the CF4 plasma not etching the first RuOx layer;
   b) etching unmasked portions of the first RuOx layer with an oxygen plasma, to form a first RuOx electrode;
   c) forming a second TiW mask on the first TiW mask, on the first RuOx electrode and on the PZT layer;
   d) etching unmasked portions of the PZT layer with a chloride and fluorocarbon plasma, to form a patterned PZT plate;
   e) forming a third TiW mask on the first RuOx electrode, on the patterned PZT plate, and on a portion of the second RuOx layer; and
   f) etching unmasked portions of the second RuOx layer, to form a second RuOx electrode.

* * * * *